(12) United States Patent
Dierickx

(10) Patent No.: US 7,564,022 B1
(45) Date of Patent: Jul. 21, 2009

(54) METHOD AND DEVICE FOR TIME-GATING THE SENSITIVITY OF AN IMAGER STRUCTURE

(75) Inventor: Bart Dierickx, David Hansenstraat 7, B-2650 Edegem (BE)

(73) Assignees: Caeleste Cvba, Edegem (BE); Bart Dierickx, Edegem (BE)

( * ) Notice: Subject to any disclaimer, the term of this patent is extended or adjusted under 35 U.S.C. 154(b) by 0 days.

(21) Appl. No.: 12/073,094

(22) Filed: Feb. 29, 2008

(51) Int. Cl.
*H03F 3/08* (2006.01)
*H01L 31/00* (2006.01)
*H04N 5/335* (2006.01)

(52) U.S. Cl. ............... 250/214 R; 250/214.1; 257/E27.132; 348/294

(58) Field of Classification Search ............ 250/214 R, 250/552, 553, 214 A, 208.1; 356/432–435; 398/202–214; 348/294–324
See application file for complete search history.

(56) References Cited

U.S. PATENT DOCUMENTS

| | | | | |
|---|---|---|---|---|
| 4,980,546 A | * | 12/1990 | Berger | 250/208.1 |
| 6,465,786 B1 | * | 10/2002 | Rhodes | 250/338.4 |
| 6,512,547 B1 | * | 1/2003 | Miida | 348/310 |
| 2003/0223053 A1 | * | 12/2003 | Liu et al. | 356/5.1 |

FOREIGN PATENT DOCUMENTS

WO   WO 02/33817   4/2004

OTHER PUBLICATIONS

Lehmann et al. "Smart Pixels for Future 3D-TOF Sensors." Kanizawa, Japan, Jun. 9-11, 2005, Proceedings, p. 193-196.
D. Van Niewonhone. Novel Standard CMOS Detector using Majority Current for guiding Photo-Generated Electrons towards Detecting Junctions. Proceeding symposium IEEE/LEOS Benelux Chapter 2005 p. 229-232.
R. Jeremias et al. a CMOS Photo Sensor Array for 30 Imaging Using Pulsed Laser. IEEE International Solid state circuits conference, 2001, Digest of Technical Papers. ISSCC 2001, Session 96, pp. 252-253, 452-453.
Elkhali et al. "A 64×8 Pixal 3-D CMOS Time of Flight Image Sensor for Car Safety Applications", IEEE 1-4244-0303-0406, 2006.
Burak, et al. A time-of-flight Depth Sensor-System Description, Issues and Solutions. Undated paper, 9 pages.

* cited by examiner

*Primary Examiner*—Georgia Y Epps
*Assistant Examiner*—Jennifer Bennett
(74) *Attorney, Agent, or Firm*—Bacon & Thomas, PLLC

(57) ABSTRACT

A method for time-gating the sensitivity of an imager structure having a plurality of photodiodes comprises applying an electric field over the photodiodes, the electric field having an amplitude and a polarity so as to reverse bias or slightly forward bias the photodiodes at a bias voltage below 0.5 Volts, and varying the photodiodes between high and low charge collection efficiency or sensitivity by changing the amplitude of the electric field over the photodiodes. A corresponding imager structure is also provided.

14 Claims, 5 Drawing Sheets

METHOD AND DEVICE FOR TIME-GATING THE SENSITIVITY OF AN IMAGER STRUCTURE

TECHNICAL FIELD OF THE INVENTION

The present invention relates to methods and devices for time-gating the sensitivity of an imager structure.

BACKGROUND OF THE INVENTION

For several applications, such as for example laser distance ranging or time gating, very fast electronic shutters, fast electrically programmable changing of sensitivity volume of a pixel or of sensitivity of a pixel, it is needed that impinging radiation is alternatingly visible (detector is sensitive for impinging radiation) and not visible (detector is insensitive for impinging radiation) during a single integration time. Making the detector alternatingly sensitive and insensitive to the impinging radiation is also called "time-gating the radiation". It has the advantage that it allows to read out a total accumulated charge of many smaller time periods with the read noise of one single readout operation.

Time-gating of radiation can be obtained by using a mechanical shutter, or by pulsing a grid in an image amplification tube (also called photomultiplier tube or valve amplifier).

Other techniques can be solid state based.

The most well-known solid state techniques are the so-called "electronic shutter" methods. In the classical electronic shutters, a pixel can be made effectively sensitive during a precise part of a total frame time, called the "integration time", which integration time is then typically determined as the time between the end of the pixel reset, and the moment of readout or of "sample & hold". However, such methods are only suitable when the radiation must be gated as one single continuous time period or integration time.

Another solid state solution is disclosed by M. Lehman & al. in "Smart pixels for future 3D TOF sensors", IEEE Workshop on CCD and advance image sensors, Karuizawa Japan, Jun. 9-11 2005, proceedings p. 193. This solution is based on a CCD principle, which is non-standard and expensive. Furthermore, it shows difficulties when working with thick (hence sensitive) silicon layers.

Yet another solid state solution is disclosed by D. Van Nieuwenhove et al. in "A novel Standard CMOS detector using majority current for guiding Photo-generated electrons towards detecting junctions", proceedings symposium IEEE/ LEOS Benelux chapter, 2005, p. 229-232. This solution is based on majority current assisting movement of charge carriers. It is a disadvantage of this solution that the assisting majority current consumes high peak currents and power, and that the on/off ratio is limited.

Still another solution is based on the work of Rudolf Schwarte, and is for example disclosed in WO 02/33817. This document essentially describes a method to demodulate radiation that is modulated. The teaching of this document is based on the concept that electrical field lines are such that they start at one diode and end at another. This is effective and needed when the signal charges are assumed to emerge in the volume where these electrical field lines reign.

Electric domain demodulation is described in "A CMOS photosensor array for 3D imaging using pulsed laser", Jeremias, R.; Brockherde, W.; Doemens, G.; Hosticka, B.; List I, L.; Mengel, P. IEEE International Solid-State Circuits Conference, 2001. Digest of Technical Papers. ISSCC. 2001 Session 16, 2001 Page(s):252-253, 452-453: demodulations in the electric signal are performed, i.e. after the light signal or photo charge has been converted to an electrical signal or voltage. However, the applicability is limited. The electric domain demodulation is inherently very noisy, as the differencing operation (that is essentially demodulation) now happens after noise has already entered into the signal.

Each of the above solutions has manufacturing and operational disadvantages.

SUMMARY OF THE INVENTION

It is an object of embodiments of the present invention to provide good apparatus or methods for time-gating of radiation to be detected.

The above objective is accomplished by a method and device according to the present invention.

In a first aspect, the present invention provides a method for time-gating the sensitivity of an imager structure having a plurality of photodiodes. The method comprises applying an electric field over the photodiodes, the electric field, e.g. a voltage, having an amplitude and a polarity so as to reverse or slightly forward bias the photodiodes at a bias voltage below 0.5 Volts, and varying the photodiodes between high and low charge collection efficiency or sensitivity by changing the amplitude of the electric field over the photodiodes.

In embodiments of the present invention, radiation may be impinging from the topside of the imager structure. In alternative embodiments of the present invention, radiation may be impinging from the backside of the imager structure. In this case, the imager structure preferably has a backside thinned configuration.

In embodiments of the present invention the charge collected may be accumulated over a plurality of cycles of changing the voltage over the photodiodes.

In embodiments of the present invention, the charge collected by at least one of the photodiodes may be amplified.

In embodiments of the present invention, the electric field changes, e.g. bias voltage changes, only happen on some of the photodiodes. At the same time, the other photodiodes may have a more or less stable bias.

In embodiments of the present invention, the electric field change may be performed by any of applying a voltage, changing the virtual ground of a feedback amplifier or capacitive coupling.

In a second aspect, the present invention provides an imager structure comprising:

a semiconductor substrate, a plurality of photodiodes on or in the substrate, electric field generating means for applying an electric field over the at least one photodiode, the electric field having an amplitude and a polarity so as to reverse bias or slightly forward bias the photodiodes at a bias voltage below 0.5 Volts, and switching means for changing the amplitude of the electric field over the at least one photodiode.

It is an advantage of an imager structure according to embodiments of the present invention that the sensitivity of the photodiodes can be quickly switched.

In an imager structure according to embodiments of the present invention each photodiode has a depletion region, and the depletion regions of neighbouring photodiodes touch each other. An effective border of collection of charges of each diode depends on the electric field across each of the photodiodes.

In an imager structure according to embodiments of the present invention, one or more of the photodiodes may be formed by a pn junction. In alternative embodiments, one or more of the photodiodes may be formed by an inversion layer junction, e.g. an inversion layer junction under a gate.

In an imager structure according to embodiments of the present invention, at least one of the photodiodes may be connected to an amplifier. The amplifier may be any of a charge amplifier, a current amplifier or a voltage amplifier.

In an imager structure according to embodiments of the present invention, photodiodes may be arranged in a spatial pattern so as to respond to a specific spatial pattern of impinging radiation. In other words, the photodiodes in the imager structure are made sensitive to respond to such specific spatial pattern of impinging radiation.

An imager structure according to embodiments of the present invention may be adapted such that the time slots wherein the diodes are sensitive are made such that they respond to a specific temporal pattern.

In embodiments of the present invention, an imager structure may be adapted so that the diodes are sensitive both to a specific spatial pattern of impinging radiation and to a specific temporal pattern.

It is an advantage of methods and devices according to embodiments of the present invention that they are relatively easy to implement in CMOS technology. It is an advantage of methods and devices according to embodiments of the present invention that they have a straightforward operation. It is and advantage of methods and devices according to embodiments of the present invention that they can be combined with backside illumination. It is and advantage of methods and devices according to embodiments of the present invention that they can be combined with hybrid read-out, i.e. with detector and electronics being present in separated chips which may be bump or wire bonded. It is and advantage of methods and devices according to embodiments of the present invention that they can be used for EM radiation as well as for particle radiation.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
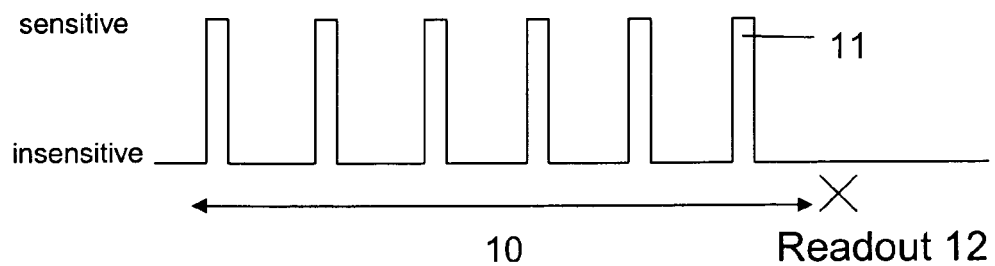
FIG. 1 illustrates the general principle of time-gating of radiation.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

For example the findings of the present invention are explained with reference to PMOS and NMOS regions as an example, but the present invention includes within its scope a complementary device whereby PMOS and NMOS regions become NMOS and PMOS regions, respectively. A skilled person can make such modifications without departing from the true spirit of the invention.

FIG. 1 illustrates the general principle of time-gating of radiation. During one integration period 10, a sensor device is made alternatingly sensitive and insensitive for the impinging radiation. During the sensitive time periods 11, collected charges are accumulated. At a readout moment 12, these accumulated charges are read out.

In a first aspect, the present invention provides a method for time-gating the sensitivity of an imager structure having a plurality of photodiodes.

Figure 2:
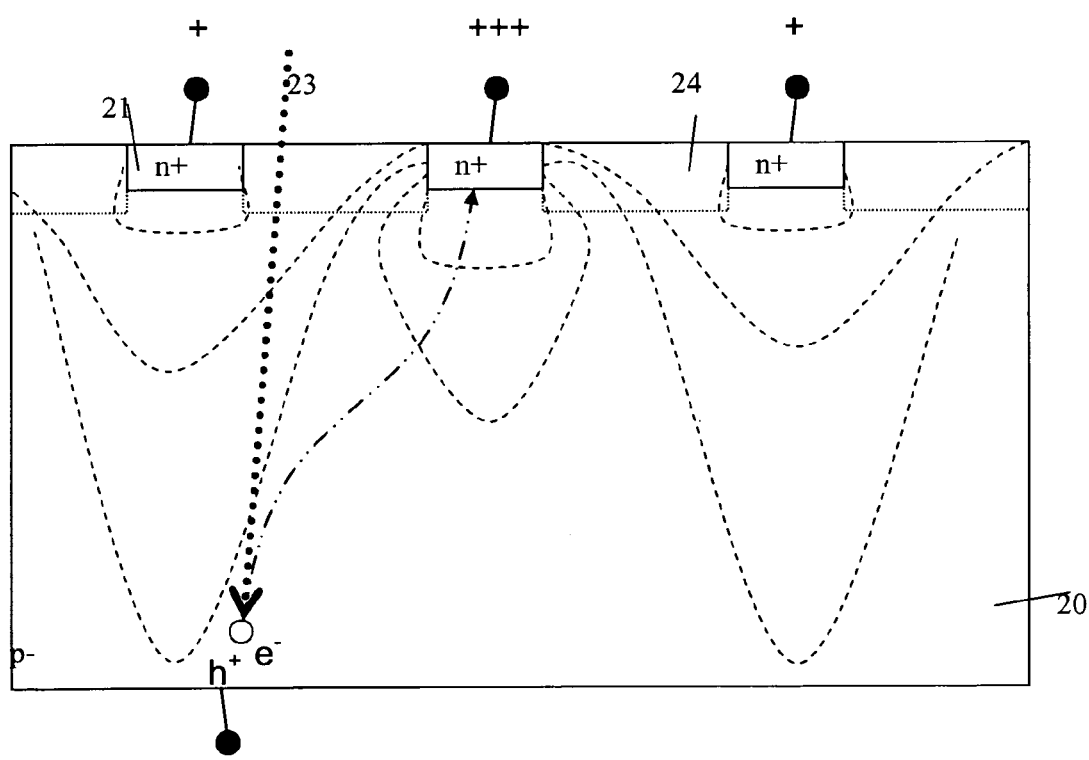
FIG. 2 is a schematic cross-section of three neighboring photodiodes in a highly resistive substrate, according to a first embodiment of the present invention.

One embodiment of such an imager structure, having a plurality of pixels or photodiodes, is illustrated in FIG. 2, showing a schematic cross-section of neighboring photodiodes in a highly resistive substrate 20. Resistivity of the substrate must be so high that the depletion layer of the different photodiodes (more or less) touch. For typical photodiode sizes or pitches, this implies dopant concentrations below $1e14/cm^3$. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. It may have the thickness of a normal wafer, or it may be thinned to a few micrometers. Also, the "substrate" may be any other base on which a layer is formed, for example a glass or metal layer. The substrate, in embodiments of the present invention, is lowly doped, e.g. having dopant concentrations of $1e14/cm^3$ or below, with dopants of a first type. In the embodiments illustrated in FIG. 2, the substrate 20 is lowly doped p-type semiconductor material, e.g. p-type silicon material.

A plurality of semiconductor diodes are provided, by providing regions 21 of a second dopant type with a high dopant level in the substrate 20, the second dopant type being different from the first dopant type, and the high dopant level being significantly above the doping level of the substrate, e.g. a factor hundred or more above the doping level of the substrate, e.g. a high dopant level of $1e16/cm^3$ or more. In the embodiment illustrated in FIG. 2, three highly-doped n-type regions 21 are provided in the p-type substrate 20, thus providing pn-junctions.

By contacting highly doped regions 21 of the second dopant type, e.g. n-type, with the lowly doped substrate 20 of the first dopant type, e.g. p-type, a depletion layer 22 or depletion region is formed between both, which extends deep in the substrate 20. Such depletion layer 22 is formed because electrons from the n-doped region (if left to their own, would) diffuse into the p-doped region where there is a large population of holes with which the electrons then would recombine, e.g. in the embodiment illustrated electrons from the highly doped n-region 21 would diffuse into the lowly doped p-substrate 20. The fact that this does not happen is due to the spontaneous creation of a "built-in" electrical field around the junction that counteracts diffusion of electrons towards the p-region and holes towards the n-region. In the region where this electric field reigns free carriers are pulled away to their respective majority sides. This region, where an electrical field points from n-region to p-region, is also called "depletion region or layer". The depth of the depletion region is tunable by a bias voltage which, in embodiments of the present invention, may be chosen so that the depletion layer extends at least so deep that the depletion layers of neighboring photodiodes can touch. The pixel's or photodiode's effective sensitive volume, or effective sensitivity, can be continuously tuned, either in absolute terms or relative to the volume of the neighbouring pixels or photodiodes.

In accordance with embodiments of the present invention, an electric field is placed over the photodiodes with the same polarity as the built-in potential of the depletion region. This way, the depletion region continues to act as an insulator preventing a spontaneous diffusion of majority carriers. The depletion region internally contains equipotential planes. Electric field lines are orthogonal to the depletion region and its equipotential planes.

The plurality of photodiodes are reverse biased. For the embodiment illustrated, this means that a voltage is applied over the photodiodes so that the highly doped n-regions are placed at a potential which is more positive than the potential of the lowly-doped p-substrate.

Depending on the electric field or voltage over the diodes, the equipotential planes (dotted lines in the drawings) will be placed at another location in the substrate 20. The larger the electric field over the diodes, the more the equipotential planes (planes become lines in a 2D drawing) will extend further in the substrate 20.

When radiation 23 impinges into the substrate 20, electron/hole pairs are generated in the substrate 20. The radiation generated free electrons will follow the electric field (perpendicular to the equipotential planes) towards the diode junctions. As the equipotential planes of diodes with a larger applied electric field extend deeper into the substrate 20, the "collecting volume" of the most biased diodes, in the example illustrated the most forward biased diodes, is the largest. The radiation may impinge from the backside of the imager structure, i.e. the substrate side, or from the topside of the imager structure. The impinging radiation may be electromagnetic radiation of any type, e.g. visible light, UV light, infra-red light, X-rays, gamma rays. Alternatively, the impinging radiation may be particles, including low or high energy electrons, protons, hadrons or other particles.

The method according to embodiments of the present invention comprises varying the photodiode between high and low charge collection efficiency, and thus the sensitivity of the photodiode, by changing the electric field, e.g. voltage, over the at least one photodiode. The electric field can be switched quasi instantaneously. By switching the electric field, the collecting volume and thus the sensitivity of the diodes changes.

In embodiments of the present invention, as illustrated in FIG. 2, regions 24 of the first dopant type may be provided in the substrate 20 in between two neighbouring photodiodes. In the example illustrated, the regions of the first dopant type are p-regions 24. Such regions are not essential for the operation of the imager. However, they are present in typical CMOS processes as so-called "pwell".

Figure 3:
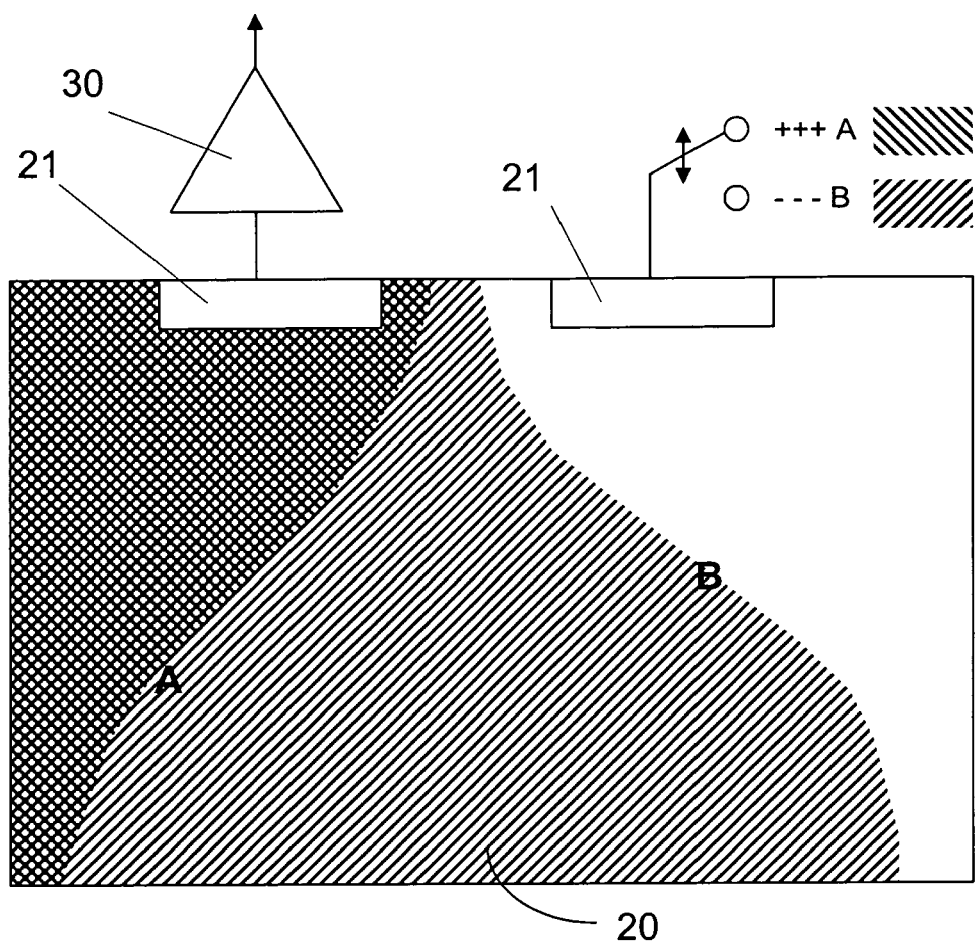
FIG. 3 is a schematic cross-section of two neighboring diodes according to a second embodiment of the present invention, illustrating that by switching the voltage on one diode, the border between the collecting volumes of each diode drastically moves.

FIG. 3 is an enlarged schematic cross-section of two neighbouring photodiodes according to an embodiment of the present invention. This drawing illustrates that by switching the electric field over the right hand diode, e.g. by switching the voltage over the diode, the border between the collecting volumes of the diodes drastically moves. The dotted line indicated with A illustrates the border between the collecting volumes in case a large positive voltage is applied to the right hand n-type region 21, while the dotted line indicated with B illustrates the border between the collecting volumes in case a negative voltage or small positive voltage is applied to the right hand n-type region 21. At low forward bias, or at weak reverse bias (<0.5V), the depletion regions are thin, and do not touch each other. Thus at least one of the photodiodes must be strongly reverse biased. The effective speed of the change of the location of this border is very fast, as little space charge must be displaced, and as the capacitance of an imager structure as described is low. The speed of change is only limited by the speed of externally changing the applied voltage, and the time it takes for majority carriers to diffuse back in the volume left by the receding depletion layer, which is in the order of nanoseconds or less.

The present invention is based on the observation that the electrical filed lines do not need to go from one photodiode to the other and vice versa. It is sufficient that the field lines go from a common substrate to the plurality of photodiodes, but that the charge collecting volume in the substrate is changing due to voltage change on the diodes.

Optionally, as also illustrated in FIG. 3, charge or voltage amplifiers 30 can be provided on certain or on all of the photodiodes. These may be adapted to read the signal from the diodes.

In embodiments of the present invention, the change of the electric field over the at least one photodiode can be applied to only some of the at least one photodiode, or to all. For example, some of the photodiodes can be kept at a fixed voltage, while the voltage on other photodiodes can switch between low and high, so as to change the sensitivity of the corresponding photodiodes to impinging radiation.

In embodiments of the present invention, the electric fields over a plurality of photodiodes can change in same directions, i.e. the electric fields over the plurality of photodiodes can all change to high or to low at substantially the same moment in time. In alternative embodiments, the electric fields over the plurality of photodiodes can change in opposite directions, e.g. if the electric field over one photodiode is switched to low, the electric field over a neighbouring photodiode is switched to high, and vice versa.

In embodiments of the present invention, care can be taken to make the charge sensing insensitive to the switching crosstalk itself and the displacements of charge involved in that. This can be achieved for example, but not limited thereto, by counterbalancing the crosstalk by a dummy capacitance. The charge of the bias voltage on one diode is capacitively felt by other diode nodes. That effect can be compensated by an equal and opposite effect on a different capacitance to the same node. Alternatively, making the charge sensing insensitive to the switching crosstalk itself and to the displacements of charge involved in that can be obtained by reading out the collected charge systematically in the same phase of the switching. In that case, the crosstalk from a disturbing node on the measurement node is of short duration and its capacitive charging effect is perfectly reversible. One may simply disregards the measurement node's signal during the times that the disturbing node is biased.

Figure 4:
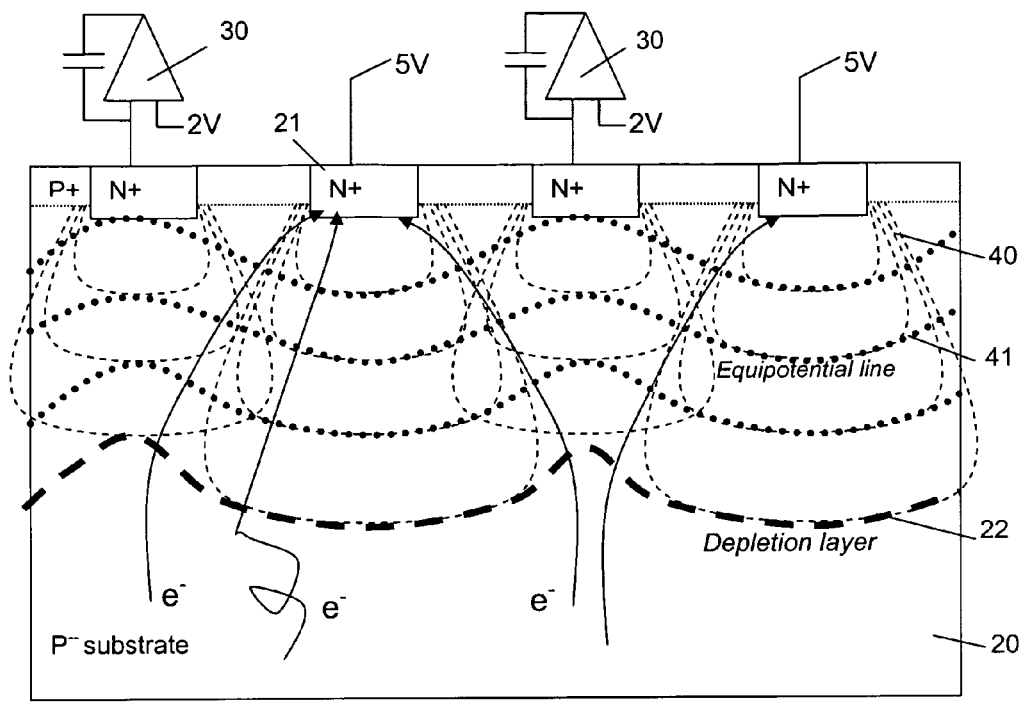
FIG. 4 and FIG. 5 illustrate the influence of a change of bias voltage over some of the diodes on depletion layers and equipotential lines/planes. In these drawings, the thin dashed lines represent equipotential lines/planes for the individual diodes, while the thick dashed lines represent equipotential lines/planes for the ensemble of diodes.
Figure 5:
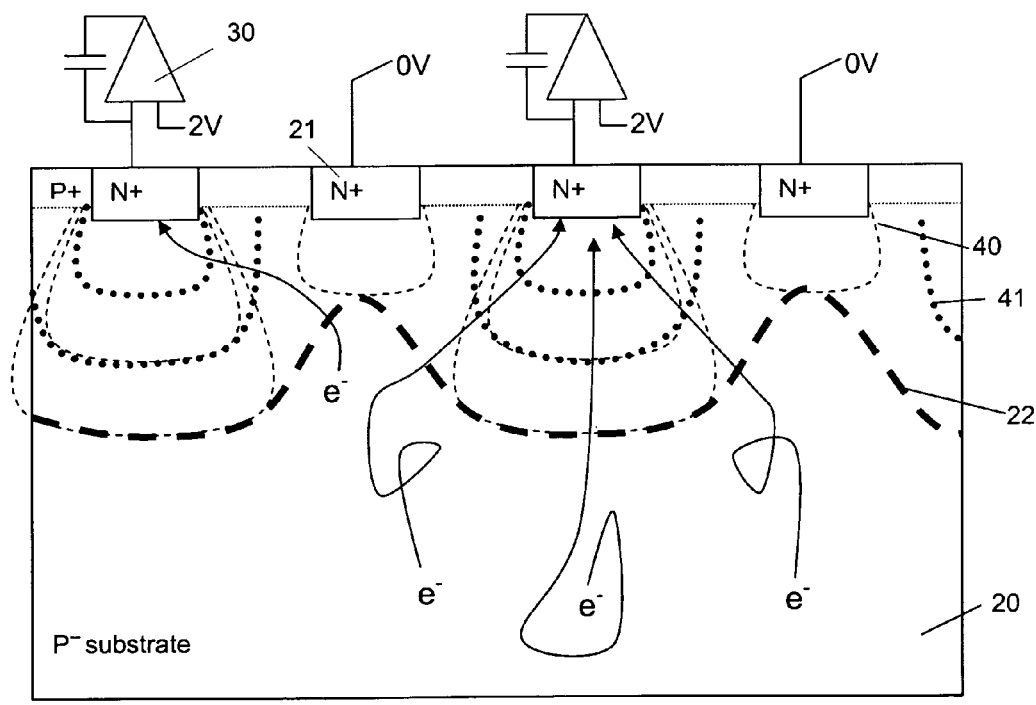

FIG. 4 and FIG. 5 illustrate an array of photodiodes, formed by highly doped regions 21 of a second conductivity type in a lowly doped substrate 20 of a first conductivity type. The array may comprise a plurality of photodiodes logically organised in rows and columns. The terms "horizontal" and "vertical" (related to the terms "row" and "column" respectively) may be used to provide a co-ordinate system and for ease of explanation only. They do not need to, but may, refer to an actual physical direction of the device. Furthermore, the terms "column" and "row" are used to describe sets of array elements which are linked together. The linking can be in the form of a Cartesian array of rows and columns however the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. By this is meant that sets of photodiodes are linked together in a topologically linear intersecting manner; however, that the physical or topographical arrangement need not be so. For example, the rows may be circles and the columns radii of these circles and the circles and radii are described in this invention as "logically organised" rows and columns.

Some of the photodiodes in the array are provided with a charge or voltage amplifier 30 as explained with reference to FIG. 3. For example, every other photodiode in the array may be provided with such charge or voltage amplifier 30. These photodiodes may be connected to a fixed voltage, i.e. a fixed electric field may be applied over these photodiodes. The other photodiodes may be connected to a means for switching the electric field over the photodiodes, e.g. by switching the voltage applied to the n-type region 21, while keeping constant the voltage applied to the substrate 20. In the example illustrated, the voltage to some diodes is kept constant at 2V, while the voltage applied to the other diodes switches between 5V and 0V.

A comparison of FIG. 4 and FIG. 5 illustrates that due to a change, for example a quick change with a duration shorter than 1 ns, of a bias voltage over some of the photodiodes, the merging depletion layers result in a different outline of the equipotential planes. As the electric field is perpendicular to the equipotential planes, the sensitivity of the two sets of diodes changes greatly. In this example, the set of diodes with the charge amplifier is at +/−constant bias, while the other diodes change bias. This, however, is not mandatory. Diodes can be connected to a charge or current or voltage amplifier 30, and can still change bias quickly with large amplitude. Suitable switching circuits are known to a person skilled in the art.

As the depletion layer is moved by switching the electric field over at least some of the diodes, the collecting volume is changed, and other diodes become more sensible to impinging radiation. In both cases of FIG. 4 and FIG. 5, the most inversely biased diodes have the biggest depletion region and will be most sensible to radiation generated charge carriers.

In FIG. 4 and FIG. 5, the thin dashed lines illustrate 2D views of equipotential planes 40 as would be created by single diodes not in an array. The dotted lines 41 illustrate 2D views of equipotential planes generated by placing the diodes in the array as illustrated in the drawings. The thick dashed line shows the border 22 of the depletion layer.

To give an idea of the order of magnitude of size of the depletion region:

For $1e14/cm^3$ substrate doping, the depletion layer extends:

| Bias voltage across diode | Depletion layer thickness (approximately) |
|---|---|
| 0 V | 2.9 um |
| 1 V | 4.6 um |
| 2 V | 6 um |
| 5 V | 8 um |

For $2e13/cm^3$ substrate doping, the depletion layer extends:

| Bias voltage across diode | Depletion layer thickness (approximately) |
|---|---|
| 0 V | 6.2 um |
| 1 V | 10 um |
| 2 V | 13 um |
| 5 V | 19 um |

One can even consider to slightly forward bias a diode, in order to have even less depletion volume. Such forward bias is acceptable up to the limit that the forward current will degrade the amplifier's signals, this is typically to about 0.5V forward bias.

Figure 6:
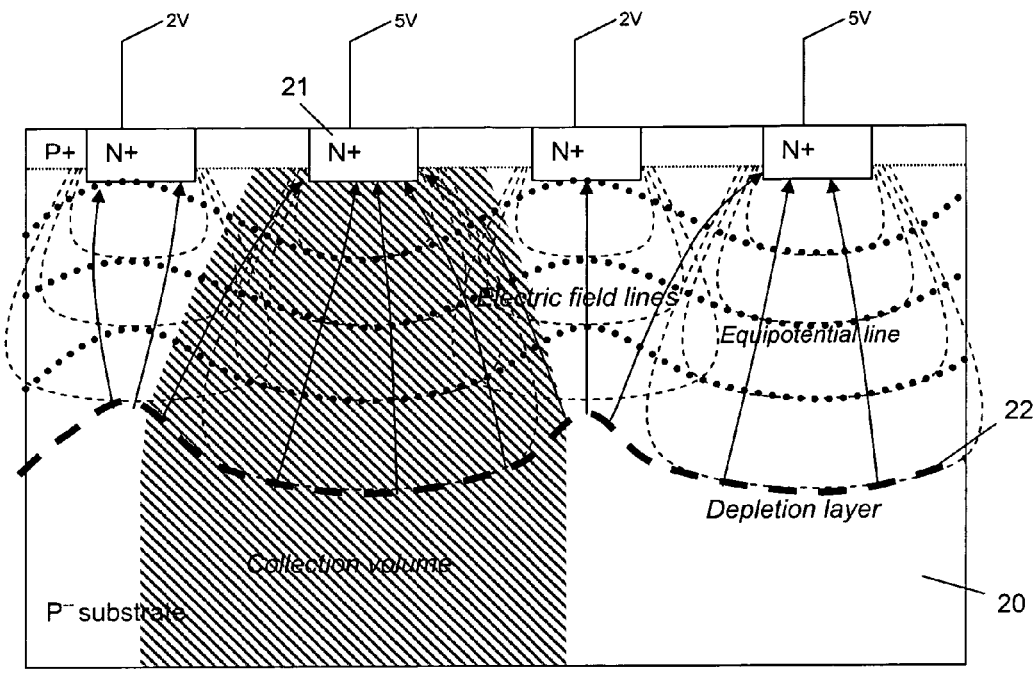
FIG. 6 illustrates collection volume of a photodiode according to embodiments of the present invention.

FIG. 6 illustrates the flow of electric filed lines and equipotential planes. The collection volume of a diode indicates that, if electrons are generated in that volume by impinging radiation, they will likely be collected by that diode, in accordance with embodiments of the present invention.

In the above embodiments, the radiation receptors or photodiodes are classic pn-junctions, be it that one side to the diode is lowly doped to yield the large, tunable extension of the depletion layer.

Figure 7:
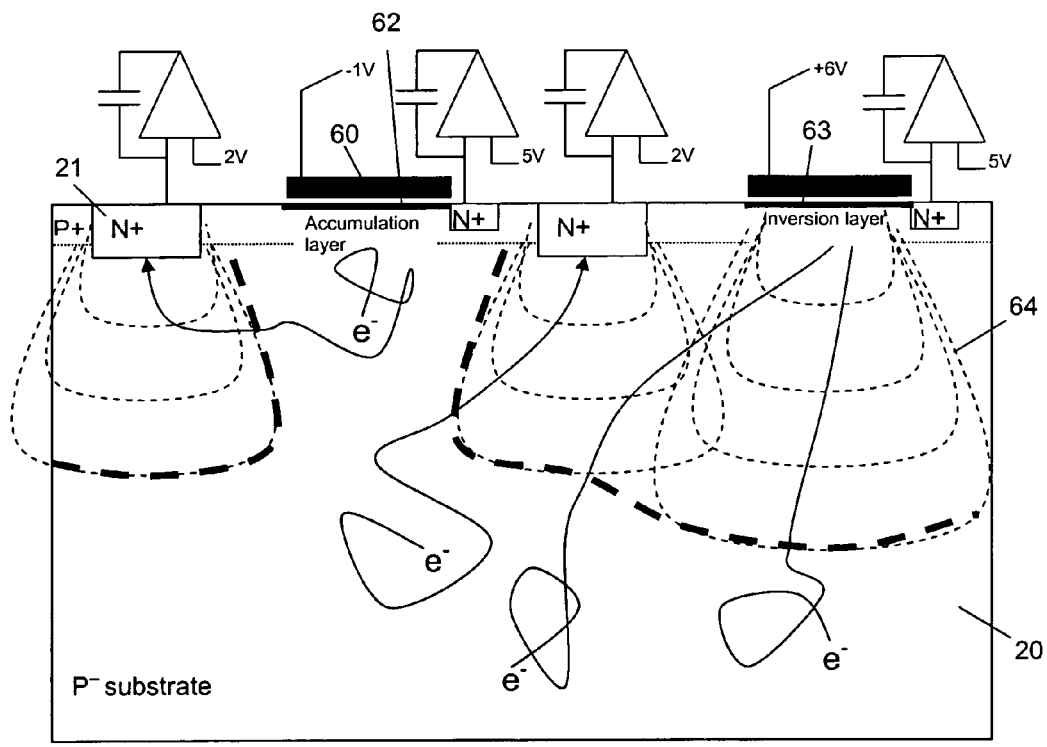
FIG. 7 illustrates an alternative embodiment of an imager structure of the present invention, wherein the diodes are implemented as gated diodes.

Alternative implementations exist for the photodiodes, which in some cases give even a higher ratio of sensitivity versus blindness. One such embodiment is the use of a gated diode, as illustrated in FIG. 7. A gated diode is a diode structure with an additional gate terminal 60. It is a two-terminal device in which charge is stored when a voltage above a threshold voltage is applied between the gate and a source 61, and negligible charge is stored otherwise. In the embodiment illustrated, if the gates are reversely biased, at the interface with the p-substrate 20, an "accumulation layer" 62 is formed. This accumulation layer 62 is unable to collect the radiation induced charge carriers, e.g. radiation induced electrons. If the gate 60 is biased forwardly, an inversion layer 63 can form if this inversion layer is connected to an n-region 61, just as with an nMOSFET transistor. The potential of that inversion layer 63 will be (about) equal to the potential of the n-region 61, and have a similar depletion layer shape and extension as if the inversion layer as a real n-doped layer, as illustrated by the thin dashed equipotential lines 64.

Upon switching the bias voltages, this inversion layer 63 and accumulation layer 62 will form in very short time (<<nanoseconds) compared to the switching times envisaged.

Figure 8:
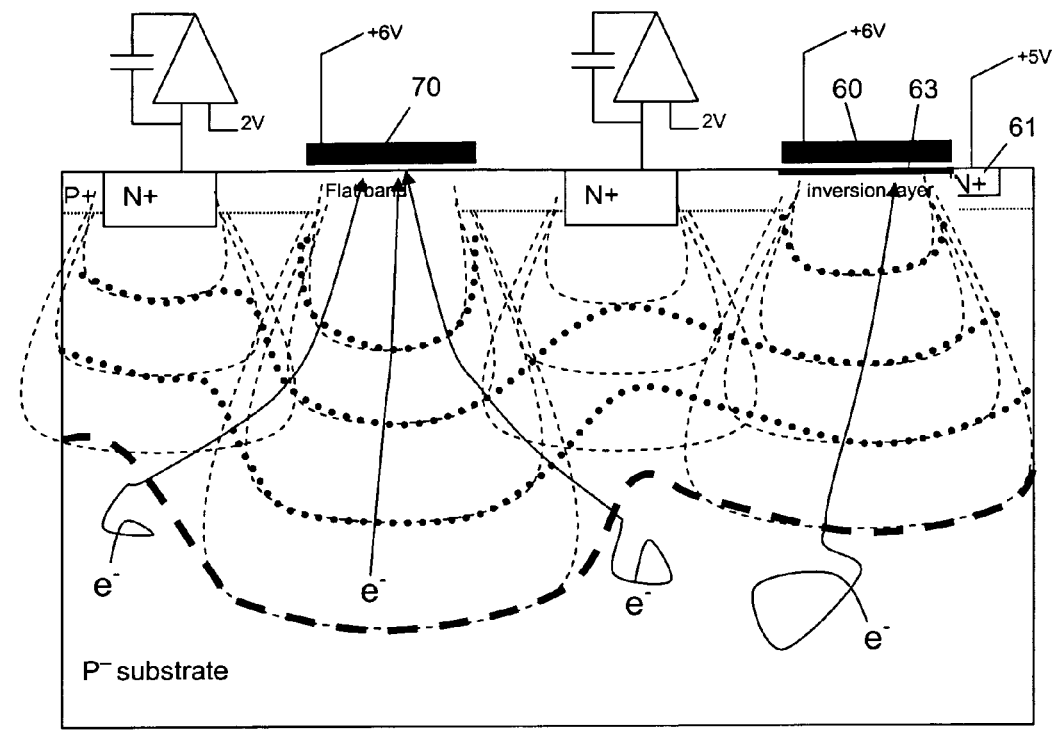
FIG. 8 illustrates an imager structure according to embodiments of the present invention, comprising a standalone gate.

If the inversion layer 63 is not connected to a n-region, as illustrated at the left hand side of FIG. 8, an accumulation layer will still form very fast (<<ns) upon correct biasing, e.g. reverse biasing, but the inversion layer will take a long time (more than milliseconds, often even more than seconds) upon correct biasing, e.g. forward biasing, which time is determined by thermal generation or by electron generation by radiation, i.e. thus by collecting the radiation induced charges themselves as indicated on FIG. 8. When there is no inversion layer in such case, the extension of the depletion layer is wider. This feature may be used to enhance the selectivity of sensitivity versus blindness. It is to be noted that when the left MOS gate voltage is brought negative again the collected electrons are lost in the substrate 20, or are recombined with accumulations holes, when the electrons are trapped at the interface. Loosing electrons in the surface means that these electrons can be collected by other diodes, which creates an error signal. This problem does not occur with the right hand MOS configuration 60, 61, 63.

In embodiments of the present invention, the electric field can be switched according to a spatial pattern amongst the diodes or pixels, which spatial pattern corresponds to a spatial pattern to be detected. This corresponds to a kind of 2D spatial pattern recognition. It will "resonate" preferentially on light sources that have the same shape as the pattern. Homogeneous sources or sources that have other shapes are not picked up as good. In such case, diodes may have individual readout, or they may be all tied together for readout. In typical applications one may see a differential readout, where the signal and its inverse are extracted from a super pixel, i.e. a group of pixels or diodes designed to respond to the spatial radiation pattern.

Figure 9:
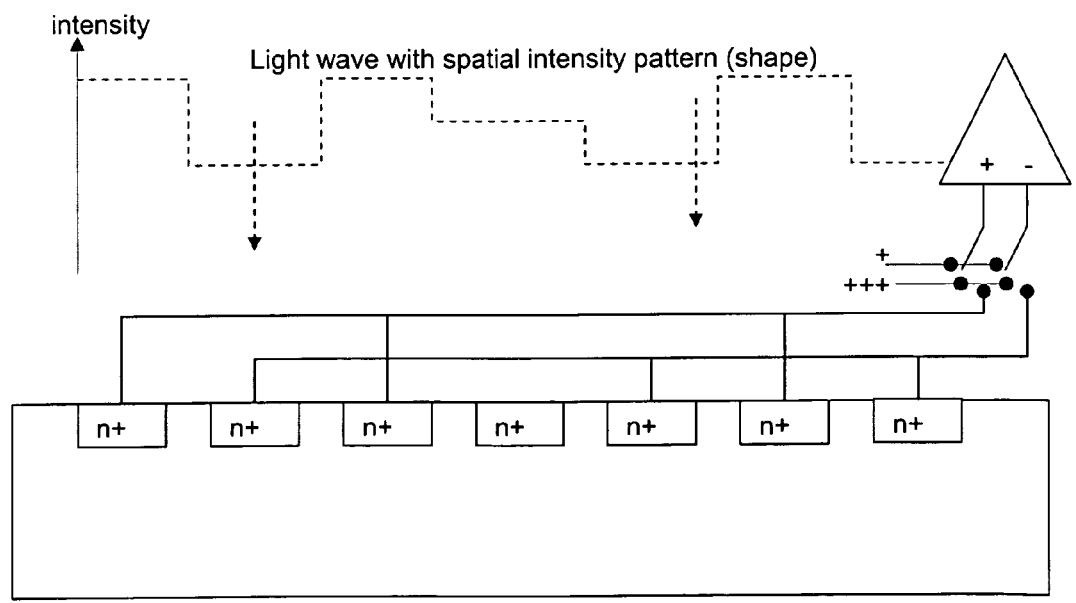
FIG. 9 illustrates an imager structure adapted for detection of a light wave with a spatial intensity pattern, according to embodiments of the present invention.

An example of a light wave with a spatial intensity pattern is illustrated in FIG. 9, here represented in only 1 dimension. The pulsed light impinging on the image sensor may contain a spatial pattern—in fact, any image is a spatial pattern. The signal of a sub part ("super pixel") of the imager's photodiodes may be combined (by wire or other wise) to a charge amplifier. This may be hard wired, or programmable (software). The said amplifier may be a single input amplifier, or it may read two such subparts (of the same or of different super pixels), so as to in situ produce a signal that stands for how good the optical input pattern matches the photodiode pattern. The groups of photodiodes may be constantly biased according to methods found in other documents of the present invention, or alternatingly, or with more complex temporal patterns.

In alternative embodiments, one can go beyond a simple pulse pattern keying on/off the sensitivity of the diodes. For example if emitters in a scene emit a particular signature (think of something as CDMA, but in radiation intensity, i.e. coding of the radiation according to a defined pattern), enhanced sensitivity, or resonance, to that signal can be created, while rejecting all other temporal patterns. Such temporal patterns may emanate from a code as e.g. emitted by an IR remote control, but may for example also be temporal signatures of chemical processes . . . . In many cases, these patterns will come through an imaging lens from a scene emitting such type of radiation pattern. This keying on/off of the sensitivity of the diodes can be applied in applications for detecting chemical or bio-chemical reactions that create a specific temporal pattern radiation. Examples can be found in the field of time-resolved spectroscopy. It is known that chemical reactions have a duration and that specific reagens in the reaction are present during specific times in a certain sequence. Their emission may be detected to give proof to the presence, quantity and time period of the reagens, thus yielding a means to identify and study substances.

In further embodiments, the above embodiments can be combined. In this embodiment, super pixels, i.e. groups of diodes with a common readout, are provided that respond to a specific spatio-temporal radiation pattern.

It is to be understood that although preferred embodiments, specific constructions and configurations, as well as materials, have been discussed herein for devices according to the present invention, various changes or modifications in form and detail may be made without departing from the scope of this invention as defined by the appended claims.

The invention claimed is:

1. Method for time-gating the sensitivity of an imager structure having a plurality of photodiodes, the method comprising applying an electric field over the photodiodes, by applying a constant bias to a first set of the photodiodes, and applying a varying bias to a second set of the photodiodes interspersed amongst the first set, so as to modulate a charge collection efficiency between high and low charge collection efficiency by changing the amplitude of the electric field over the photodiodes, and reading and amplifying an output signal only from the first set of the photodiodes.

2. Method according to claim 1, wherein radiation is impinging from a topside of the imager structure.

3. Method according to claim 1, wherein radiation is impinging from a backside of the imager structure.

4. Method according to claim 1, wherein the charge collected is accumulated over a plurality of cycles of the varying bias to the second set of the photodiodes.

5. Method according to claim 1, wherein an amplitude and a polarity of the varying bias are arranged to vary between a reverse bias and a slight forward bias of less than 0.5 Volts.

6. Method according to claim 1, wherein the electric field change is performed by any of applying a voltage, changing the virtual ground of a feedback amplifier or capacitive coupling.

7. An imager structure comprising:
a semiconductor substrate,
a plurality of photodiodes on or in the substrate, electric field generating means for applying an electric field over the at least one photodiode, so as to apply constant bias to a first set of the photodiodes,
switching means for changing the amplitude of the electric field over the at least one photodiode by applying a varying bias to a second set of the photodiodes interspersed amongst the first set, so as to modulate a charge collection efficiency between high and low charge collection efficiency by changing the amplitude of the electric field over the photodiodes, and
an amplifier for reading and amplifying an output signal only from the first set of the photodiodes.

8. An imager structure according to claim 7, each photodiode having a depletion region, wherein the depletion regions of neighbouring photodiodes touch each other.

9. An imager structure according to claim 8, wherein an effective border of collection of charges of each diode depends on the electric field across each of the photodiodes.

10. An imager structure according to claim 7, wherein the photodiodes are formed by an inversion layer junction.

11. An imager structure according to claim 10, wherein the photodiodes are formed by an inversion layer junction under a gate.

12. An imager structure according to claim 7, wherein the amplifier is any of a charge amplifier, a current amplifier or a voltage amplifier.

13. An imager structure according to claim 7, wherein photodiodes are arranged in a spatial pattern so as to respond to a specific spatial pattern.

14. An imager structure according to claim 7, adapted such that the modulation of the charge collection efficiency is arranged to make the photo diodes sensitive such that they respond to a specific temporal pattern.

* * * * *